(12) United States Patent
Koide

(10) Patent No.: US 7,102,909 B2
(45) Date of Patent: Sep. 5, 2006

(54) STORAGE CIRCUIT, SEMICONDUCTOR DEVICE, AND ELECTRONIC APPARATUS

(75) Inventor: Yasunori Koide, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 11/028,579

(22) Filed: Jan. 5, 2005

(65) Prior Publication Data
US 2005/0146915 A1  Jul. 7, 2005

(30) Foreign Application Priority Data
Jan. 6, 2004  (JP) ............................. 2004-001446

(51) Int. Cl.
*G11C 11/22* (2006.01)
*G11C 7/00* (2006.01)
(52) U.S. Cl. ...................... 365/145; 365/149
(58) Field of Classification Search ............... 365/145, 365/149, 514
See application file for complete search history.

(56) References Cited

U.S. PATENT DOCUMENTS 6,285,575 B1 *  9/2001  Miwa ................... 365/145
6,288,961 B1 *  9/2001  Tanaka et al. ........... 365/210
6,337,592 B1 *  1/2002  Igarashi ................. 327/427

FOREIGN PATENT DOCUMENTS

| JP | A-64-66899 | 3/1989 |
| JP | A 2001-101875 | 4/2001 |
| JP | A 2001-189082 | 7/2001 |
| JP | A 2003-132672 | 5/2003 |

* cited by examiner

*Primary Examiner*—Son T. Dinh
(74) *Attorney, Agent, or Firm*—Oliff & Berridge, PLC

(57) ABSTRACT

A storage circuit equipped with a first ferroelectric capacitor and a second ferroelectric capacitor each having one end and another end, a first connecting section that is electrically connected to the one end of the first ferroelectric capacitor and the other end of the second ferroelectric capacitor, a second connecting section that is electrically connected to the other end of the first ferroelectric capacitor and the one end of the second ferroelectric capacitor, and a potential difference supply section that gives a predetermined potential difference between the one end of the first ferroelectric capacitor and the one end of the second ferroelectric capacitor. The potential difference supply section may preferably include a flip-flop having a first terminal and a second terminal.

7 Claims, 9 Drawing Sheets

STORAGE CIRCUIT, SEMICONDUCTOR DEVICE, AND ELECTRONIC APPARATUS

BACKGROUND

The present invention relates to storage circuits, semiconductor devices, and electronic apparatuses. In particular, the present invention relates to storage circuits that can readily read out stored data, semiconductor devices and electronic apparatuses equipped with the same, and methods for driving the same.

A conventional memory cell is disclosed in Japanese Laid-open Patent Application 64-66899 (Patent Document 1). The memory cell disclosed in the aforementioned Patent Document 1 is equipped with a static cell having two internal nodes, and a nonvolatile section having two ferroelectric capacitors. Then, by applying a voltage to the ferroelectric capacitors to the extent that the ferroelectric capacitors causes polarity inversion, a voltage on one of the internal nodes rises slightly higher than a voltage on the other of the internal nodes. By this, data is transferred from the nonvolatile section to the static cell.

[Patent Document 1] Japanese Laid-open Patent Application SHO 64-66899.

However, in the conventional memory cell described in the aforementioned Patent Document 1, for transferring data from the nonvolatile section to the static cell, it is necessary to pre-charge the bit line and further to apply the voltage to the ferroelectric capacitors. This causes a problem in that its operation becomes complex. Also, in the conventional memory cell described in the aforementioned Patent Document 1, although the voltage on one of the internal nodes becomes higher than the voltage on the other of the internal nodes, their difference is small. Therefore, there is a problem in that, if there are manufacturing variations in the threshold voltage of transistors composing the static cell, the static cell may malfunction.

Accordingly, it is an object of the present invention to provide storage circuits, semiconductor devices, and electronic apparatuses, which can solve the problems described above. This object can be achieved by combining the characteristics set forth in the independent claims in the scope of patent claims. Also, the dependent claims further define advantageous concrete examples of the present invention.

SUMMARY

To achieve the aforementioned object, in accordance with a first embodiment of the present invention, there is provided a storage circuit characterized in comprising: a first ferroelectric capacitor and a second ferroelectric capacitor each having one end and another end; a first connecting section that is electrically connected to the one end of the first ferroelectric capacitor and the other end of the second ferroelectric capacitor; a second connecting section that is electrically connected to the other end of the first ferroelectric capacitor and the one end of the second ferroelectric capacitor; and a potential difference supply section that gives a predetermined potential difference between the one end of the first ferroelectric capacitor and the one end of the second ferroelectric capacitor.

With the structure described above, the predetermined potential difference is given between the one end and the other end of the first ferroelectric capacitor, and also between the one end and the other end of the second ferroelectric capacitor. Also, the direction of the voltage applied to the first ferroelectric capacitor and the direction of the voltage applied to the second ferroelectric capacitor are mutually different. Accordingly, with the structure described above, different data can be stably stored in the first ferroelectric capacitor and the second ferroelectric capacitor with a very simple structure.

Also, the potential difference supply section may preferably have a flip-flop having a first terminal and a second terminal, wherein the flip-flop may preferably provide the predetermined potential difference between the first terminal and the second terminal, thereby giving the predetermined potential difference between the one end of the first ferroelectric capacitor and the one end of the second ferroelectric capacitor.

With the structure described above, by bringing at least one of the first terminal and the second terminal of the flip-flop to a predetermined potential, the predetermined potential difference can be generated between the first terminal and the second terminal. Accordingly, with the structure described above, different data can be more stably stored in the first ferroelectric capacitor and the second ferroelectric capacitor, and the stored data can be readily rewritten.

Also, the first connecting section may preferably have a first switch provided between the one end of the first ferroelectric capacitor and the other end of the second ferroelectric capacitor, and the second connecting section may preferably have a second switch provided between the other end of the first ferroelectric capacitor and the one end of the second ferroelectric capacitor.

With the structure described above, the one end of the first ferroelectric capacitor and the other end of the second ferroelectric capacitor can be electrically cut off from each other, and the other end of the first ferroelectric capacitor and the one end of the second ferroelectric capacitor can be electrically cut off from each other. Accordingly, for example, predetermined data written in the first ferroelectric capacitor and the second ferroelectric capacitor can be read out.

Also, the potential difference supply section may preferably give a predetermined potential difference between the one end of the first ferroelectric capacitor and the one end of the second ferroelectric capacitor, thereby writing data in the first ferroelectric capacitor and the second ferroelectric capacitor, and the storage circuit may preferably be further equipped with a reading section that reads, based on capacity of the first ferroelectric capacitor and the second ferroelectric capacitor, data written in the first ferroelectric capacitor and the second ferroelectric capacitor, and a control section that makes the first switch and the second switch conductive when the potential difference supply section writes the data in the first ferroelectric capacitor and the second ferroelectric capacitor, and makes the first switch and the second switch nonconductive when the reading section reads the data written in the first ferroelectric capacitor and the second ferroelectric capacitor.

Also, the storage circuit may preferably be further equipped with a discharge section that brings potentials on the other end of the first ferroelectric capacitor and the other end of the second ferroelectric capacitor to generally an identical potential. With this structure, a potential difference between the one end and the other end of the first ferroelectric capacitor, and between the one end and the other end of the second ferroelectric capacitor can be brought to generally zero. Accordingly, deterioration of the first ferroelectric capacitor and the second ferroelectric capacitor can be suppressed.

In accordance with a second embodiment of the present invention, there is provided a semiconductor device characterized in comprising the storage circuit recited above. It is noted here that the semiconductor device generally refers to a device composed of semiconductor, which is quipped with a storage circuit in accordance with the present invention, and is not limited to a particular structure, but may include a variety of devices that require storage devices, such as, for example, ferroelectric memory devices, DRAMs, flash memories and the like, which are equipped with the storage circuit described above.

In accordance with a third embodiment of the present invention, there is provided an electronic apparatus characterized in comprising the semiconductor device described above. It is noted here that the electronic apparatus generally refers to an apparatus equipped with a semiconductor device in accordance with the present invention, which achieves predetermined functions, and is not limited to a particular structure, but may include a variety of devices that require storage devices, such as, for example, computer devices in general, portable telephones, PHSs, PDAs, electronic notebooks, IC cards, and the like, which are equipped with the semiconductor device described above.

DETAILED DESCRIPTION OF EMBODIMENTS

The present invention is described below based on embodiments of the present invention with reference to the accompanying drawings. However, the embodiments described below do not in anyway limit the invention concerning the scope of patent claims, and all the combinations of the characteristics described in the embodiments would not necessarily be indispensable as the means for solution of the invention.

Figure 1:
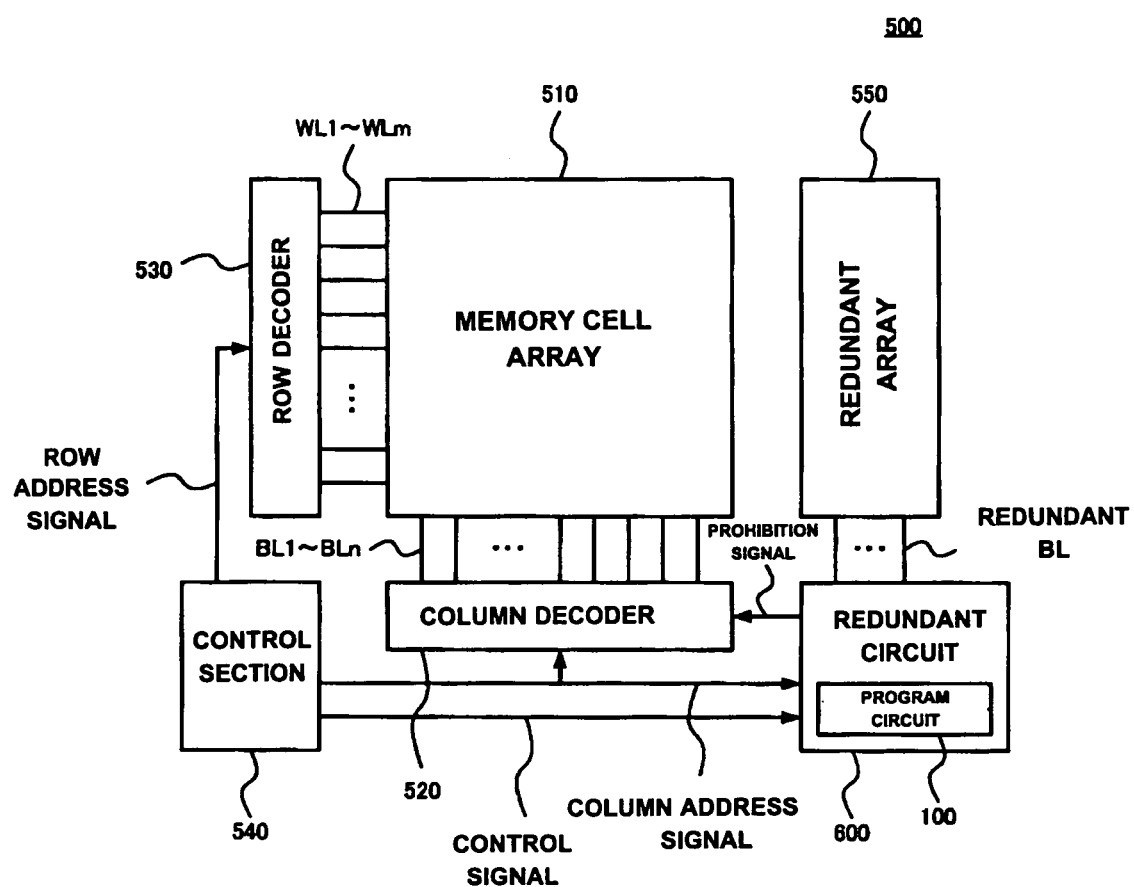
FIG. 1 is a diagram showing a structure of a ferroelectric memory device 500 which is an example of a semiconductor device in accordance with an embodiment of the present invention.

FIG. 1 is a diagram showing a structure of a ferroelectric memory device 500 which is an example of a semiconductor device in accordance with an embodiment of the present invention. The ferroelectric memory device 500 is equipped with a memory cell array 510, a column decoder 520, a row decoder 530, a control section 540, a redundant array 550, and a redundant circuit 600.

The memory cell array 510 has a structure equipped with a plurality of ferroelectric capacitors disposed in an array. Each of the ferroelectric capacitors is controlled by a bit line BL and a word line WL among word lines WL1–WLm (m is an integer of 2 or greater) and bit lines BL1–BLn (n is an integer of 2 or greater), respectively. More specifically, by controlling potentials on the bit line BL and the word line WL, data written in the corresponding ferroelectric capacitor can be read, or data can be written in the corresponding ferroelectric capacitor.

The control section 540 generally controls operations of the ferroelectric memory device 500. More specifically, the control section 540 supplies row address signals and column address signals to the row decoder 530 and the column decoder 520, respectively, to read data from the ferroelectric capacitors, and to write data in the ferroelectric capacitors. Also, the control section 540 supplies control signals to the redundant circuit 600 to control a program circuit 100. Also, the control section 540 generates a driving voltage to drive the ferroelectric memory device 500, and supplies the same to various sections including the program circuit 100.

The row decoder 530 controls potentials on the word lines WL1–WLm. More specifically, the row decoder 530 receives a row address signal from the control section 540, and selects a specified word line WLj (j is an integer of 1 through m), based on the row address signal. Also, the column decoder 520 controls potentials on the bit lines BL1–BLn. More specifically, the column decoder 520 receives a column address signal from the control section 540, and selects a specified bit line BLk (k is an integer of 1 through n), based on the column address signal. By this, one of the ferroelectric capacitors corresponding to the word line WLk selected by the row decoder 530 and the bit line BLk selected by the column decoder 520.

The redundant circuit 600 has a structure having a plurality of program circuits 100. The redundant circuit 600 generates, based on an output signal outputted from the program circuit 100 and a column address signal, a prohibition signal to prohibit access to a specified bit line BLk specified by the output signal and the column address signal, and supplies the same to the column decoder 520. Also, when the bit line BLk whose access is prohibited is selected, the redundant circuit 600 controls the redundant cell array 550 to select a redundant bit line BL instead of the bit line BLk. In other words, the redundant circuit 600 replaces the bit line BLk whose access is prohibited with a redundant bit line.

Figure 2:
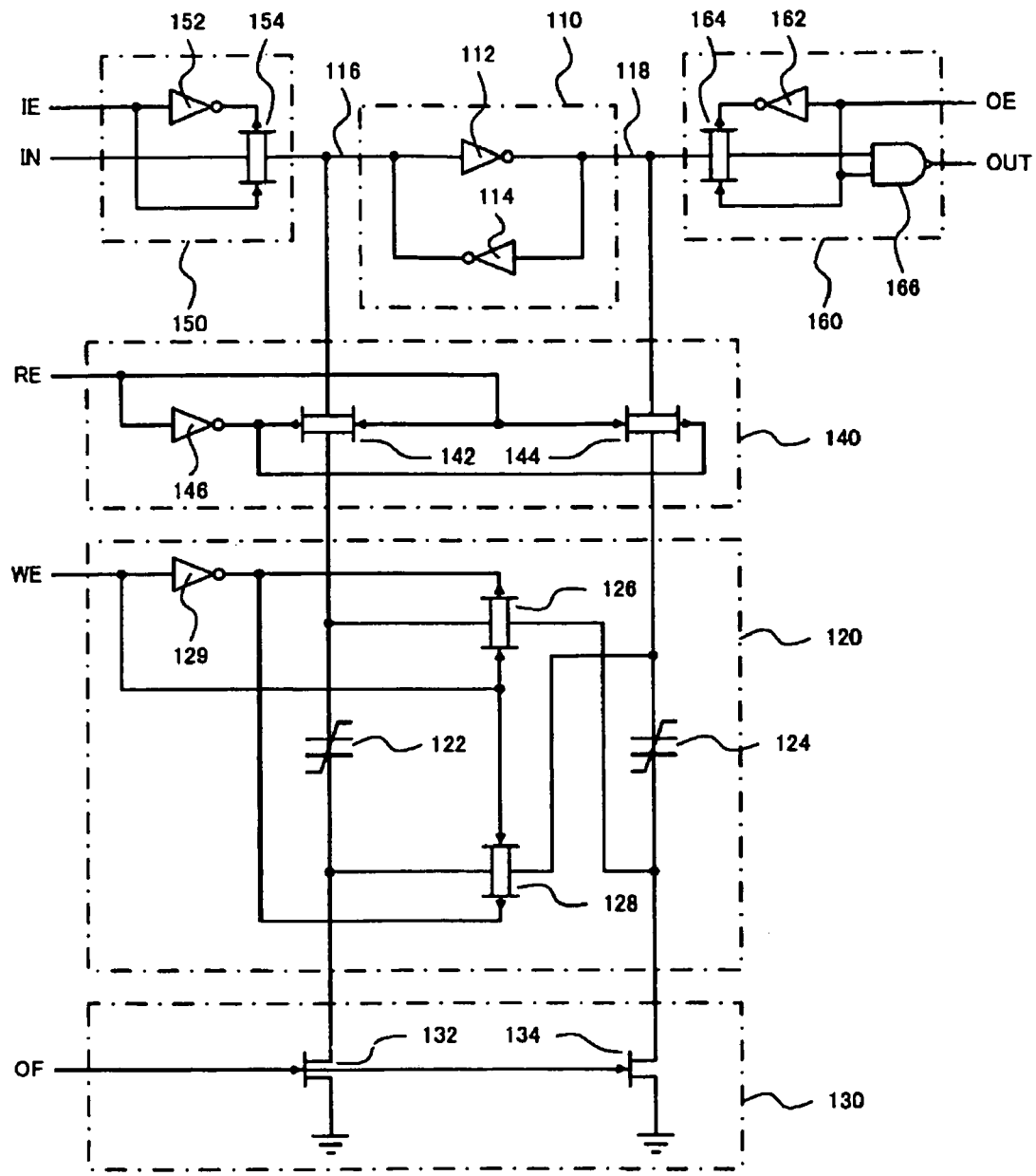
FIG. 2 is a diagram indicating a program circuit 100 in accordance with a first embodiment.

FIG. 2 is a diagram indicating the program circuit 100 in accordance with the first embodiment. The program circuit 100 has a structure equipped with a flip-flop 110, a storage section 120, a discharge section 130, a connecting section 140, a write section 150, and an output section 160. The program circuit 100 is a circuit that reads memory data stored in the storage section 120 that is a nonvolatile storage device, writes the memory data read out in the flip-flop 110, to thereby supply the memory data externally as an output signal OUT.

The flip-flop 110 is an example of a potential difference supply section, and is formed from a first inverter 112 and a second inverter 114, and a first terminal 116 and a second terminal 118 which electrically connect the flip-flop 110 to an external component. Each of the first inverter 112 and the second inverter 114 has an input terminal and an output terminal, wherein the output terminal of the first inverter 112 is electrically connected to the input terminal of the second inverter 114, and the output terminal of the second inverter 114 is electrically connected to the input terminal of the first inverter 112. Also, the input terminal of the first inverter 112 and the output terminal of the second inverter 114 are electrically connected to the first terminal 116, and the output terminal of the first inverter 112 and the input terminal of the second inverter 114 are electrically connected to the second terminal 118.

The storage section 120 has a structure equipped with a first ferroelectric capacitor 122 and a second ferroelectric capacitor 124, transfer gates 126 and 128 which are an example of a connection section, and a third inverter 129. Each of the first ferroelectric capacitor 122 and the second ferroelectric capacitor 124 has one end and another end.

One end of the first ferroelectric capacitor 122 is electrically connected to the first terminal 116 through the connecting section 140, and one end of the second ferroelectric capacitor 124 is electrically connected to the second terminal 118 through the connecting section 140. Also, the other end of the first ferroelectric capacitor 122 and the other end of the second ferroelectric capacitor 124 are electrically connected to the discharge section 130.

The transfer gate 126 is electrically connected to the one end of the first ferroelectric capacitor 122 and the other end of the second ferroelectric capacitor 124, and controls, based on a potential of a control signal WE, as to whether or not the one end of the first ferroelectric capacitor 122 and the other end of the second ferroelectric capacitor 124 are to be electrically connected. The transfer gate 128 is electrically connected to the other end of the first ferroelectric capacitor 122 and the one end of the second ferroelectric capacitor 124, and controls, based on a potential of the control signal WE, as to whether or not the other end of the first ferroelectric capacitor 122 and the one end of the second ferroelectric capacitor 124 are to be electrically connected.

More specifically, the control signal WE is supplied to gates of n-type MOS transistors that compose the transfer gates 126 and 128, and an inverted signal of the control signal WE is supplied to gates of p-type MOS transistors. Then, the transfer gates 126 and 128 become conductive when the control signal WE indicates logical H, and become nonconductive when the control signal WE indicates logical L. In other words, when the control signal WE indicates logical H, the one end of the first ferroelectric capacitor 122 and the other end of the second ferroelectric capacitor 124 have generally the same potential, and the other end of the first ferroelectric capacitor 122 and the one end of the second ferroelectric capacitor 124 have generally the same potential.

In the present embodiment, because the first ferroelectric capacitor 122 and the second ferroelectric capacitor 124 store complementary data, the first ferroelectric capacitor 122 and the second ferroelectric capacitor 124 have mutually different capacities based on paraelectric characteristics. Accordingly, when the flip-flop 110 and the storage section 120 are electrically connected, the first ferroelectric capacitor 122 gives a predetermined capacity to the first terminal 116, and the second ferroelectric capacitor 124 gives a capacity different from the predetermined capacity to the second terminal 118.

The discharge section 130 is composed of n-type MOS transistors 132 and 134, and brings the other end of the first ferroelectric capacitor 122 and the other end of the second ferroelectric capacitor 124 to generally the same potential. More specifically, either the sources or the drains of the n-type MOS transistors 132 and 134 are electrically connected to the other end of the first ferroelectric capacitor 122 and the other end of the second ferroelectric capacitor 124, respectively, and the others are grounded. The n-type MOS transistors 132 and 134 bring the potential on both of the other end of the first ferroelectric capacitor 122 and the other end of the second ferroelectric capacitor 124 to 0V, in other words, generally the same potential, based on the potential of a control signal OF supplied to their gates.

Also, the control section 540 makes the transfer gates 126 and 128 and the n-type MOS transistors 132 and 134 conductive when the flip-flop 110 is electrically cut off from the storage section 120, thereby bringing the one end and the other end of the first ferroelectric capacitor 122, and the one end and the other of the second ferroelectric capacitor 124 to generally the same potential. In other words, voltages applied to the first ferroelectric capacitor 122 and the second ferroelectric capacitor 124 are discharged.

The connecting section 140 is composed of transfer gates 142 and 144, and a fourth inverter 146, and controls as to whether or not the flip-flop 110 and the storage section 120 are to be electrically connected, based on the potential of a control signal RE. The transfer gate 142 is electrically connected to the first terminal 116 and the one end of the first ferroelectric capacitor 122, and controls as to whether or not the first terminal 116 and the one end of the first ferroelectric capacitor 122 are to be electrically connected, based on the potential of the control signal RE. Also, the transfer gate 144 is electrically connected to the second terminal 118 and the one end of the second ferroelectric capacitor 124, and controls as to whether or not the second terminal 118 and the one end of the second ferroelectric capacitor 124 are to be electrically connected, based on the potential of the control signal RE.

More specifically, a control signal RE is supplied to gates of n-type MOS transistors that compose the respective transfer gates 142 and 144, and an inverted signal of the control signal RE is supplied to gates of p-type MOS transistors. The transfer gates 142 and 144 become conductive when the control signal RE indicates logical H, and become nonconductive when it indicates logical L.

The writing section 150 writes memory data in the flip-flop 110 based on the potentials of control signals IE and IN. The writing section 150 is composed of a fifth inverter 152 and a transfer gate 154. The fifth inverter 152 receives the control signal IE as an input, and supplies an inverted signal of the control signal IE to a gate of a p-type MOS transistor that composes the transfer gate 154. The transfer gate 154 has one end being supplied with the control signal IN, and another end electrically connected to the first terminal 116. Also, the control signal IE is supplied to a gate of an n-type MOS transistor that composes the transfer gate 154. In other words, the writing section 150 controls as to whether or not the control signal IN is to be supplied to the first terminal 116 based on the potential of the control signal IE, thereby controlling the potential on the first terminal 116. By this, predetermined memory data can be written in the flip-flop 110.

The output section 160 outputs an output signal OUT indicating memory data stored in the flip-flop 110, based on the potential of a control signal OE. In the present embodiment, the output section 160 is composed of a sixth inverter 162, a transfer gate 164, and a NAND circuit 166.

The sixth inverter 162 receives the control signal OE as an input, and supplies an inverted signal of the control signal OE to a gate of a p-type MOS transistor that composes the transfer gate 164. The transfer gate 164 has one end electrically connected to the second terminal 118, and another end electrically connected to one of the input terminal of NAND circuit 166. Also, the control signal OE is supplied to a gate of an n-type MOS transistor that composes the transfer gate 164. The NAND circuit 166 outputs a negative logical product of the control signal OE and the potential on the other end of the transfer gate 164 as an output signal OUT. In other words, the output signal OUT is an inverted logical of the logical on the terminal 118 when the control signal OE is in logical H, and is always in logical H without regard to the state of the terminal 118 when the control signal OE is in logical L.

Figure 3:
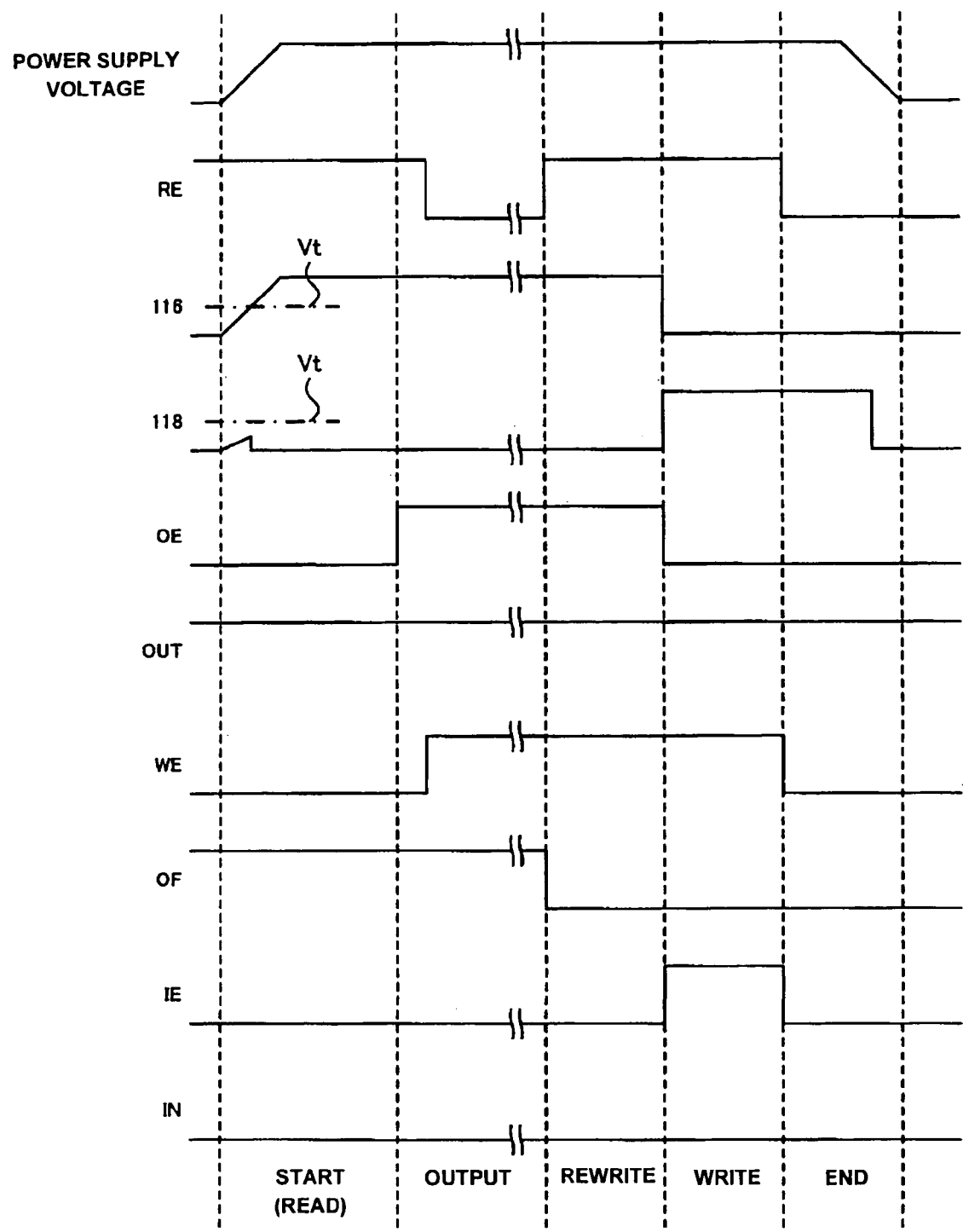
FIG. 3 is a timing chart indicating operations of the program circuit 100 in accordance with the first embodiment.

FIG. 3 is a timing chart indicating operations of the program circuit 100 in accordance with the first embodiment. Each of the control signals in the present embodiment is a digital signal indicating logical H or logical L. The potential of each control signal, when the control signal indicates logical H, is generally at the same potential as that of the driving voltage VCC of the ferroelectric memory device 500. Also, the potential of each control signal, when the control signal indicates logical L, is at a grounding potential, in other words, 0V.

Figure 4:
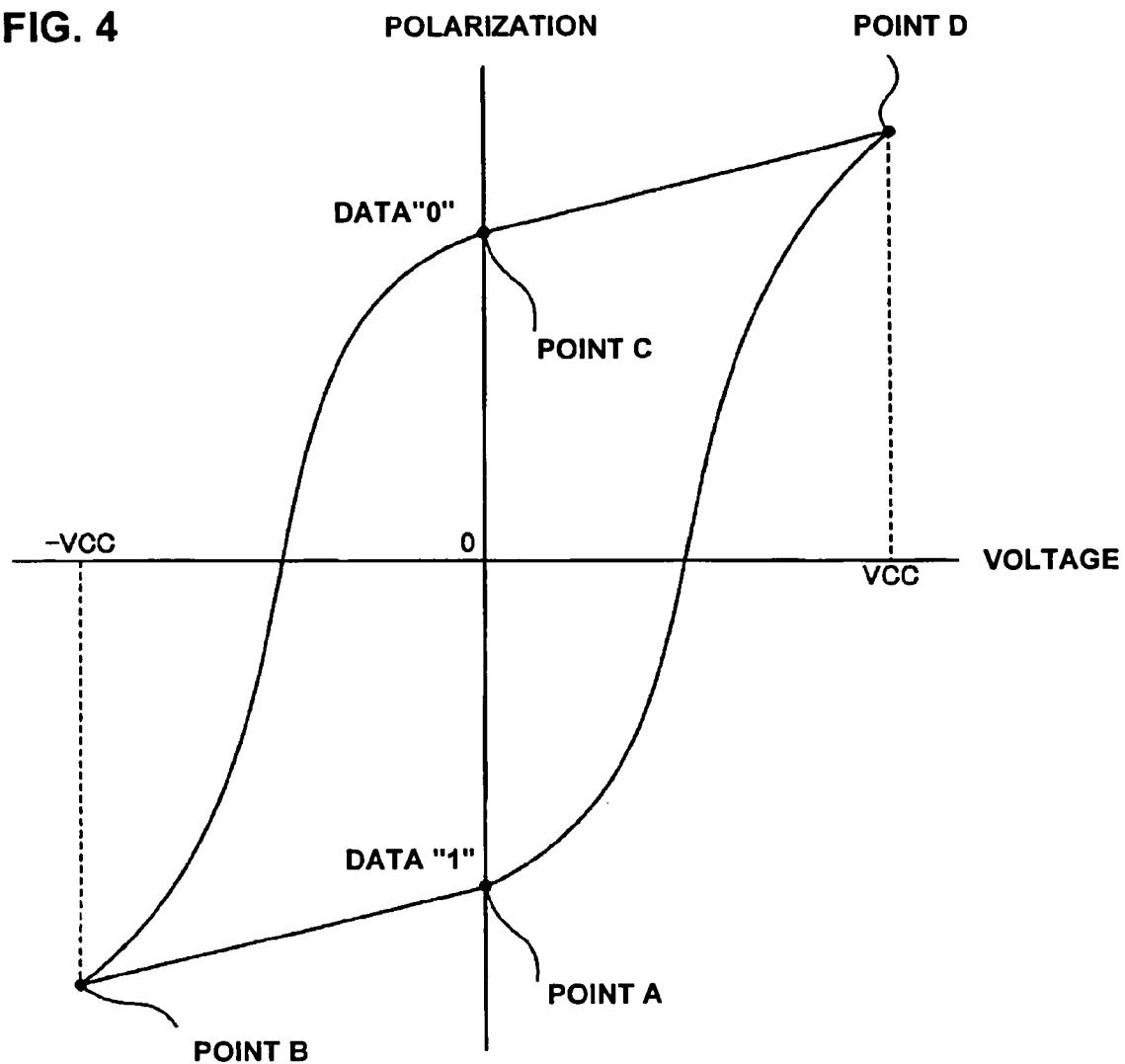
FIG. 4 is a diagram indicating hysteresis characteristics of a first ferroelectric capacitor 122 and a second ferroelectric capacitor 124.

FIG. 4 is a diagram indicating hysteresis characteristics of the first ferroelectric capacitor 122 and the second ferroelectric capacitor 124. In the figure, an axis of ordinates indicates polarizations of the first ferroelectric capacitor 122 and the second ferroelectric capacitor 124, and an axis of abscissas indicates voltages that are applied to the first ferroelectric capacitor 122 and the second ferroelectric capacitor 124. In the figure, when the potential on one ends of the first ferroelectric capacitor 122 and the second ferroelectric capacitor 124 is higher than the potential on the other ends thereof, voltages applied to the first ferroelectric capacitor 122 and the second ferroelectric capacitor 124 are expressed in the positive side.

Also, in the present embodiment, data "0" is written in the first ferroelectric capacitor 122, and data "1" is written in the second ferroelectric capacitor 124. In other words, the first ferroelectric capacitor 122 has a capacity C0 based on its paraelectric characteristic, and the second ferroelectric capacitor 124 has a capacity C1 that is greater than the capacity C0 as a capacity based on its paraelectric characteristic. Also, because the voltage that is applied to the first ferroelectric capacitor 122 and the second ferroelectric capacitor 124 is 0V in an initial state, their hysteresis characteristics are at point C and point A, respectively. Operations of the program circuit 100 of the present embodiment are described below with reference to FIG. 2 through FIG. 4.

First, in an initial state, the control signal RE indicates logical H. Accordingly, the transfer gates 142 and 144 are conductive, such that the first terminal 116 and the one end of the first ferroelectric capacitor 122 are electrically connected, and the second terminal 118 and the one end of the second ferroelectric capacitor 124 are also electrically connected. In other words, the capacity C0 is appended to the first terminal 116 by the first ferroelectric capacitor 122, and the capacity C1 is appended to the second terminal 118 by the second ferroelectric capacitor 124.

Also, the control signal WE indicates logical L in the initial state. Accordingly, the transfer gates 126 and 128 are nonconductive, such that the one end of the first ferroelectric capacitor 122 and the other end of the second ferroelectric capacitor 124, and the other end of the first ferroelectric capacitor 122 and the one end of the second ferroelectric capacitor 124 are respectively electrically cut off from one another. Also, because the control signal OF indicates logical H, the n-type MOS transistors 132 and 134 are conductive, such that the other end of the first ferroelectric capacitor 122 and the other end of the second ferroelectric capacitor 124 are grounded.

When feeding of a power supply voltage to the flip-flop 110 is started, the power supply voltage that is fed to the first inverter 112 and the second inverter 114 gradually rises. At this moment, the potential of the input to the first inverter 112 and the second inverter 114 is 0V, and therefore the potentials of outputs of the first inverter 112 and the second inverter 114 also rise with the rise of the power supply voltage. It is noted that the power supply voltage is a voltage of the power supply that operates the flip-flop 110, and is, for example, a driving voltage VCC.

At this moment, the capacity C0 is appended to the first terminal 116 by the first ferroelectric capacitor 122, and the capacity C1 that is greater than the capacity C0 is appended to the second terminal 118 by the second ferroelectric capacitor 124. In other words, to raise the potentials on the first terminal 116 and the second terminal 118, the capacities C0 and C1 need to be charged, respectively. In the present embodiment, a greater capacity is appended to the second terminal 118 than to the first terminal, such that the potential on the first terminal 116 rises quicker than the potential on the second terminal 118 does. Accordingly, the potential on the first terminal 116 reaches a threshold voltage Vt of the first inverter 112 and the second inverter 114 earlier than the potential on the second terminal 118 does. It is noted here that the threshold voltage Vt of an inverter is a voltage at which the logical value of an output of the inverter changes.

When the potential on the first terminal 116 reaches the threshold voltage Vt, the output of the first inverter 112 changes to logical L. Accordingly, when the potential on the first terminal 116 reaches the threshold voltage Vt, the potential on the second terminal 118 falls to 0V. Also, when the potential on the second terminal 118 falls to 0V, the output of the second inverter 114 would change to logical H. Accordingly, when the potential on the first terminal 116 reaches the threshold voltage Vt, the potential on the first terminal 116 becomes to be generally the same potential of the power supply voltage. By this, the flip-flop 110 retains memory data in which the potential on the first terminal 116 is in logical H, and the logical value on the second terminal 118 is in logical L. By the operations described above, memory data stored in the storage section 120 is read out, and the memory data is retained on the flip-flop 110. In other words, the flip-flop 110 in accordance with the present embodiment functions as a potential difference supply section that gives a potential difference across the one end of the first ferroelectric capacitor 122 and the one end of the second ferroelectric capacitor 124, and also functions as a reading section that reads out memory data stored in the first ferroelectric capacitor 122 and the second ferroelectric capacitor 124.

Next, the control section 540 (see FIG. 1) changes the control signal OE to logical H, thereby making the transfer gate 164 conductive. By this, the NAND circuit 166 outputs an output signal OUT indicating the memory data that is retained by the flip-flop 110. In other words, because the logical value on the second terminal 118 is logical L, the output section 160 outputs logical H as a logical value indicating the memory data. It is noted that, in the present embodiment, the logical value of the output signal OUT, before the control signal OE is changed to logical H, is also logical H, such that the logical value of the output signal OUT is kept maintained at logical H. By the operations described above, the memory data retained at the flip-flop 110 is outputted from the output section 160 as the output signal OUT.

While the output section 160 is outputting the output signal OUT indicating the memory data, the storage section 120 may preferably be electrically cut off from the flip-flop 110. In accordance with the present embodiment, the control section 540 changes the control signal RE to logical L, to make the transfer gates 142 and 144 nonconductive, thereby electrically cutting off the storage section 120 from the flip-flop 110. Also, the control section 540 changes the control signal WE to logical H, thereby electrically connecting the one end of the first ferroelectric capacitor 122 and the other end of the second ferroelectric capacitor 124, and the other end of the first ferroelectric capacitor 122 and the one end of the second ferroelectric capacitor 124. It is noted here that, because the other end of the first ferroelectric capacitor 122 and the other end of the second ferroelectric capacitor 124 are grounded, the voltage applied to the first ferroelectric capacitor 122 and the second ferroelectric capacitor 124 becomes to be generally 0V.

Next, a rewriting operation for storing in the storage section 120 memory data that is the same as the memory data retained by the flip-flop 110 is conducted. The rewriting operation may preferably be conducted after the output section 160 starts outputting the output signal OUT by the time when feeding of the power supply voltage to the flip-flop 110 is completed.

First, the control section 540 changes the control signal RE to logical H, thereby electrically connecting the storage section 120 and the flip-flop 110. In other words, the one end of the first ferroelectric capacitor 122 is electrically connected to the first terminal 116, and the one end of the second ferroelectric capacitor 124 to the second terminal 118. It is noted here that, because the flip-flop 110 retains memory data through setting the logical value on the first terminal 116 to be logical H, and the logical value on the second terminal 118 to be logical L, the potential on the one end of the ferroelectric capacitor 122 becomes to be VCC, and the potential on the one end of the ferroelectric capacitor 124 becomes to be 0V.

Also, the control section 540 changes the control signal OF to logical L, thereby maintaining the control signal WE kept at logical H. Accordingly, the one end of the first ferroelectric capacitor 122 and the other end of the second ferroelectric capacitor 124, and the other end of the first ferroelectric capacitor 122 and the one end of the second ferroelectric capacitor 124 are brought to generally the same potential, respectively. In other words, the potential on the one end of the first ferroelectric capacitor 122 and the other end of the second ferroelectric capacitor 124 becomes to be VCC, and the potential on the other end of the first ferroelectric capacitor 122 and the one end of the second ferroelectric capacitor 124 becomes to be 0V, such that the voltage applied to the first ferroelectric capacitor 122 becomes to be VCC and the voltage applied to the second ferroelectric capacitor 124 becomes to be –VCC.

Accordingly, referring to FIG. 4, because the hysteresis characteristic of the first ferroelectric capacitor 122 moves to point D, and the hysteresis characteristic of the second ferroelectric capacitor 124 moves to point B. Accordingly, data "0" is rewritten in the first ferroelectric capacitor 122, and data "1" is rewritten in the second ferroelectric capacitor 124.

Next, a writing operation for storing desired memory data in the storage section 120 is described. In an example described below, an operation to store memory data that is different from memory data stored in the storage section 120 in the storage section 120, in other words, an operation to write data "1" in the first ferroelectric capacitor 122, and data "0" in the second ferroelectric capacitor 124, is described.

First, in a state in which the storage section 120 and the flip-flop 110 are electrically connected, the control section 540 changes the control signal IE to logical H, thereby making the transfer gate 154 conductive. Then, the control section 560 changes the potential of the control signal IN to 0V, thereby bringing the potential on the first terminal 116 to 0V. By this, the output of the first inverter 112 becomes to be logical H, such that the potential on the second terminal 118 becomes to be VCC and the output of the second inverter 114 becomes to be logical L.

At this moment, because the control signal WE is logical H, the one end of the first ferroelectric capacitor 122 and the other end of the second ferroelectric capacitor 124, and the other end of the first ferroelectric capacitor 122 and the one end of the second ferroelectric capacitor 124 are brought to generally the same potential. In other words, the potential on the one end of the first ferroelectric capacitor 122 and the other end of the second ferroelectric capacitor 124 becomes to be 0V, and the potential on the other end of the first ferroelectric capacitor 122 and the one end of the second ferroelectric capacitor 124 becomes to be VCC, such that the voltage applied to the first ferroelectric capacitor 122 becomes to be –VCC, and the voltage applied to the second ferroelectric capacitor 124 becomes to be VCC.

Accordingly, referring to FIG. 4, because the hysteresis characteristic of the first ferroelectric capacitor 122 moves to point B, and the hysteresis characteristic of the second ferroelectric capacitor 124 moves to point D, data "1" is written anew in the first ferroelectric capacitor 122, and data "0" is written anew in the second ferroelectric capacitor 124.

Figure 5:
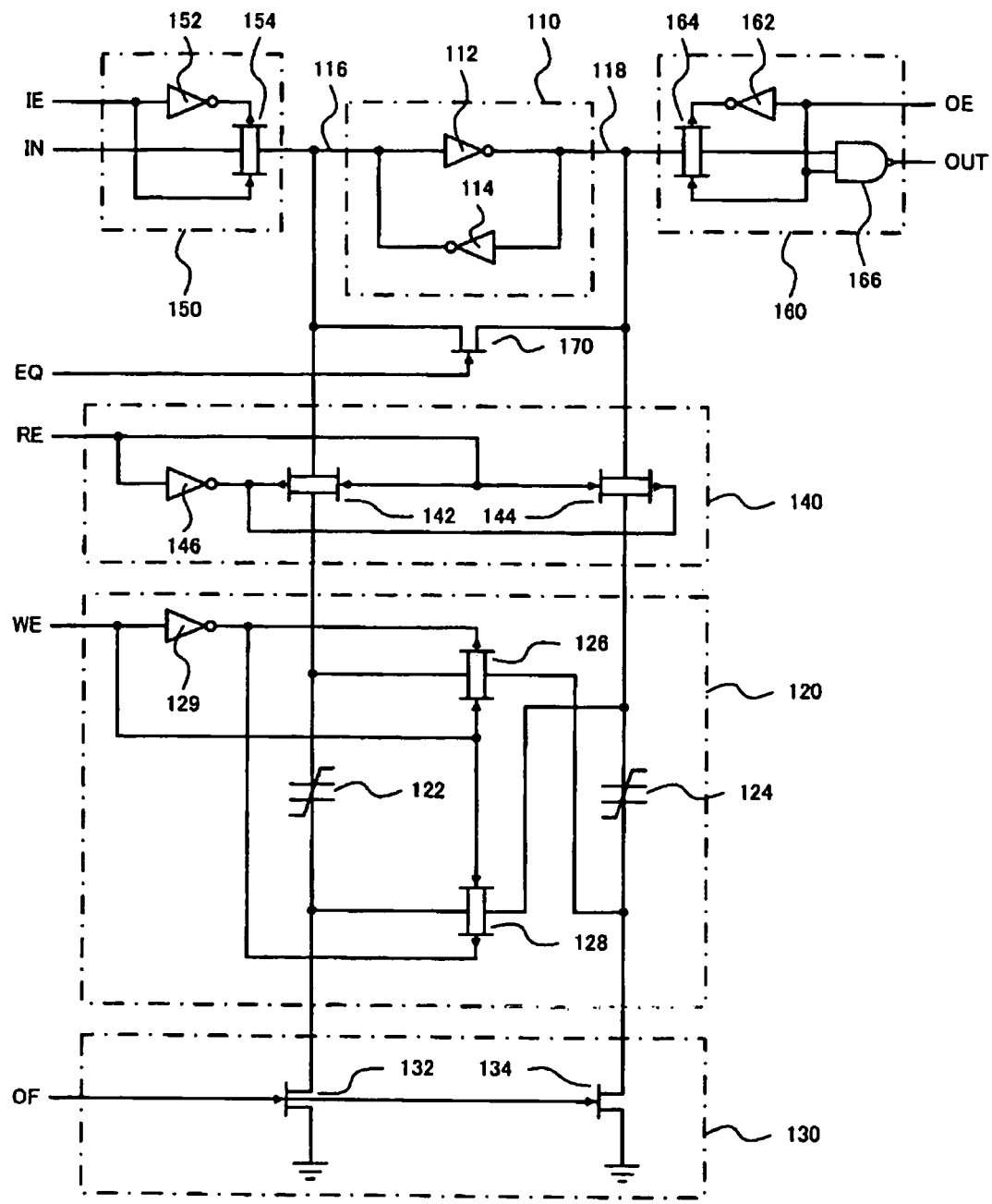
FIG. 5 is a diagram indicating a program circuit 100 in accordance with a second embodiment.

FIG. 5 is a diagram indicating a program circuit 100 in accordance with a second embodiment. The program circuit 100 of the second embodiment is described below, focusing on features different from those of the first embodiment. It is noted that components appended with the same reference numbers as those of the first embodiment have functions similar to those of the first embodiment.

The program circuit 100 in accordance with the second embodiment has a structure that is further equipped with a short-circuit section 170 in addition to the structure of the first embodiment. The short-circuit section 170 short-circuits the first terminal 116 and the second terminal 118. In other words, the short-circuit section 170 brings the potential on the first terminal 116 and the potential on the second terminal 118 to generally the same potential.

In the present embodiment, the short-circuit section 170 is composed of an n-type MOS transistor. More specifically, one of the source and the drain of the n-type MOS transistor is electrically connected to the first terminal 116, and the other is electrically connected to the second terminal 118. Then the n-type MOS transistor controls, based on the potential of a control signal EQ supplied to its gate, as to whether or not the first terminal 116 and the second terminal 118 are to be short-circuited.

Figure 6:
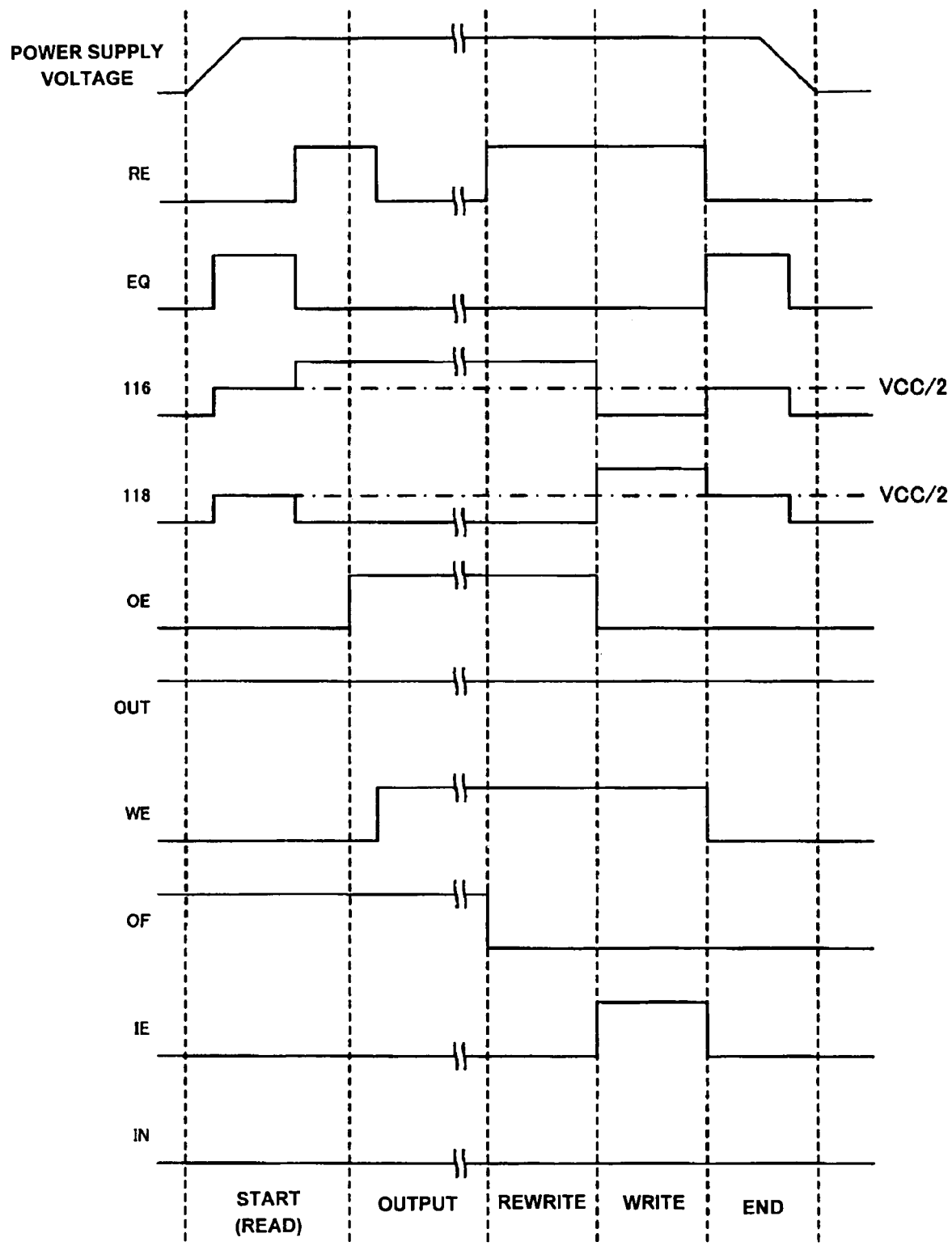
FIG. 6 is a timing chart indicating operations of the program circuit 100 in accordance with the second embodiment.

FIG. 6 is a timing chart indicating operations of the program circuit 100 in accordance with the second embodiment. Operations of the program circuit 100 in accordance with the present embodiment are described with reference to FIG. 5 and FIG. 6. It is noted that the program circuit 100 of the present embodiment differs from the first embodiment mainly in its reading operation, and therefore the operations of the program circuit 100 in accordance with the present embodiment are described, focusing on its reading operation.

First, in an initial state, the control signal RE indicates logical L. Accordingly, the flip-flop 110 is electrically cut off from the storage section 120. Also, the control section 540 changes the control signal EQ to logical H, before or after the power supply voltage is fed to the flip-flop 110, thereby short-circuiting the first terminal 116 and the second terminal 118. In the state in which the first terminal 116 and the second terminal 118 are short-circuited, and when the power supply voltage is fed to the flip-flop 110, potentials of outputs from the first inverter 112 and the second inverter 114 both become to be potentials between 0V and VCC. Because the first inverter 112 and the second inverter 114 in the present embodiment have generally the same structure, the potentials of the outputs from the first inverter 112 and the second inverter 114 are brought to potentials that are about a half of VCC.

Also, in the initial state, the control signal WE indicates logical L. Accordingly, the transfer gates 126 and 128 are nonconductive, such that the one end of the first ferroelectric capacitor 122 and the other end of the second ferroelectric capacitor 124, and the other end of the first ferroelectric capacitor 122 and the one end of the second ferroelectric capacitor 124 are electrically cut off from one another. Further, the control signal OF indicates logical H, and therefore the n-type MOS transistors 132 and 134 are conductive, such that the other end of the first ferroelectric capacitor 122 and the other end of the second ferroelectric capacitor 124 are grounded.

Next, the control section 540 changes the control signal RE to logical H. By this, the one ends of the first ferroelectric capacitor 122 and the second ferroelectric capacitor 124 are electrically connected to the first terminal 116 and the second terminal 118, respectively, such that a capacity C0 is appended to the first terminal 116 by the first ferroelectric capacitor 122, and a capacity C1 greater than the capacity C0 is appended to the second terminal 118 by the second ferroelectric capacitor 124.

Also, the control section 540 changes the control signal EQ to logical L. The control section 540 may preferably change the control signal EQ to logical L after the operation of the flip-flop 110 has become stable. Also, the control section 540 may preferably change the logical value of the control signal EQ according to the timing at which the flip-flop 110 and the storage section 120 are electrically connected. Also, more preferably, the control section 540 may change the control signal EQ to logical H generally at the same time as the aforementioned timing. When the control signal EQ changes to logical L, the n-type MOS transistor composing the short-circuit section 170 becomes nonconductive, and therefore the first terminal 116 and the second terminal 118 are electrically cut off from each other.

By this, when the control signal RE changes to logical H, the potential on the second terminal 118 falls greater than the potential on the first terminal 116, such that the output of the second inverter 114 becomes to be logical H, and the output of the first inverter 112 becomes to be logical L. By this, the flip-flop 110 retains memory data in which the potential on the first terminal 116 is at logical H, and the logical value on the second terminal 118 is at logical L. By the operations described above, memory data stored in the storage section 120 is read out, and the memory data is retained at the flip-flop 110.

Figure 7:
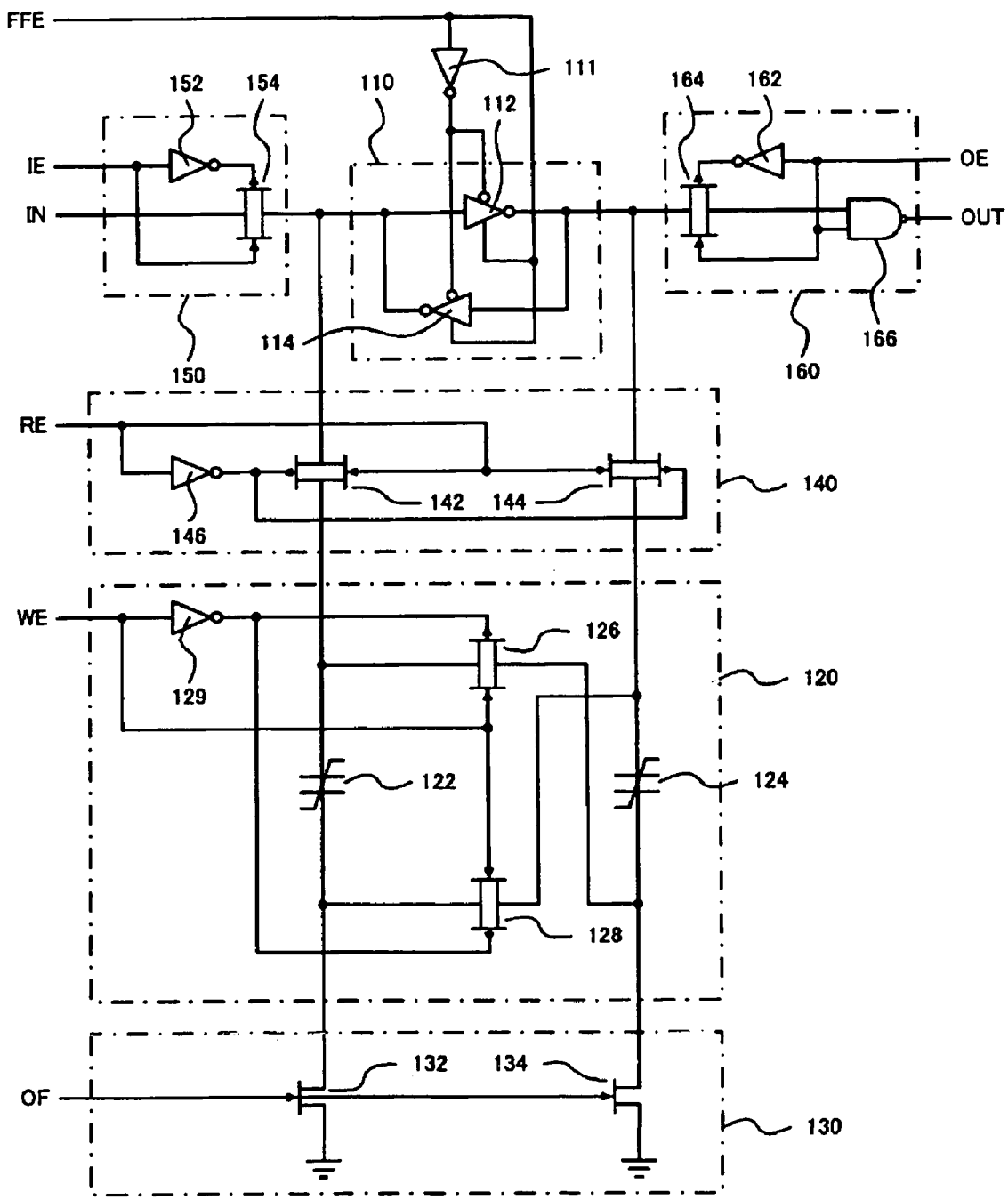
FIG. 7 is a diagram indicating a program circuit 100 in accordance with a third embodiment.

FIG. 7 is a diagram indicating a program circuit 100 in accordance with a third embodiment. The program circuit 100 in accordance with the third embodiment is described below, focusing on features different from those of the first embodiment and the second embodiment. It is noted that components appended with the same reference numbers as those of the first embodiment and/or the second embodiment have functions similar to those of the embodiments.

The program circuit 100 in accordance with the third embodiment differs from the other embodiments in the structure of its flip-flop 110. In the present embodiment, a first inverter 112 and a second inverter 114 that compose the flip-flop 110 are clocked inverters. Also, the control section 540 supplies to the flip-flop 110 a control signal FFE that is a signal to control operations of the first inverter 112 and the second inverter 114. Also, the program circuit 100 is further equipped with a seventh inverter 111 that receives the control signal FFE as an input, and supplies an inverted signal of the control signal to the first inverter 112 and the second inverter 114.

In the present embodiment, the first inverter 112 and the second inverter 114 are structured such that, when the logical value of the control signal FFE is logical H, signals received as inputs are inverted and outputted; and when the logical value of the control signal FFE is logical L, their outputs become to be of high impedance. In other words, the first inverter 112 and the second inverter 114 in accordance with the present embodiment are structured to operate when the logical value of the control signal FFE is logical H.

Figure 8:
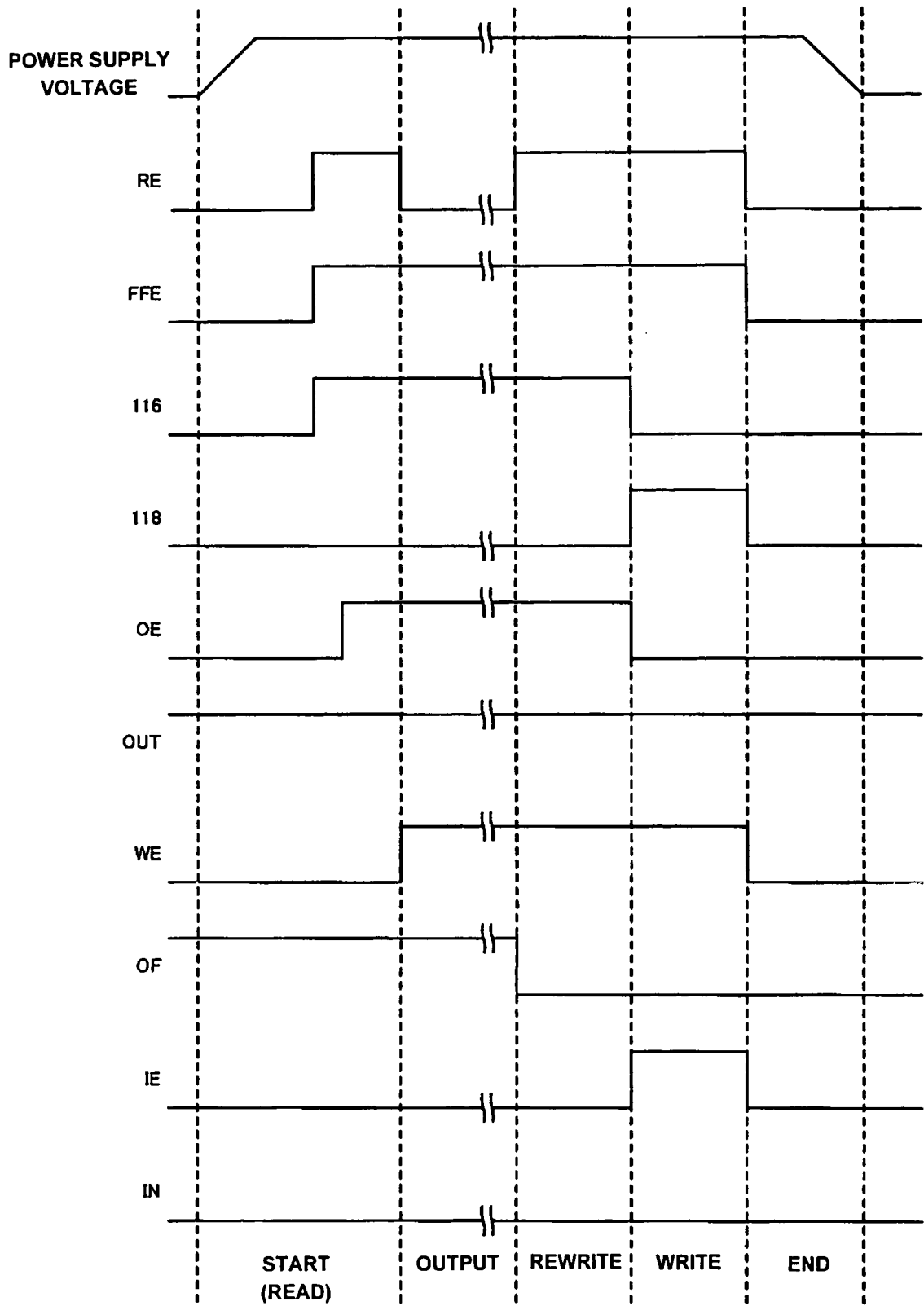
FIG. 8 is a timing chart indicating operations of the program circuit 100 in accordance with the third embodiment.

FIG. 8 is a timing chart indicating operations of the program circuit 100 in accordance with the third embodiment. Operations of the program circuit 100 in accordance with the present embodiment are described with reference to FIG. 7 and FIG. 8. It is noted that the program circuit 100 of the present embodiment differs from the first embodiment and the second embodiment mainly in its reading operation, and therefore the operations of the program circuit 100 in accordance with the present embodiment are described, focusing on its reading operation.

First, the control section 540 changes the control signal RE indicating logical L to logical H. By this, one ends of the first ferroelectric capacitor 122 and the second ferroelectric capacitor 124 are electrically connected to the first terminal 116 and the second terminal 118, respectively, such that a capacity C0 is appended to the first terminal 116 by the first ferroelectric capacitor 122, and a capacity C1 greater than the capacity C0 is appended to the second terminal 118 by the second ferroelectric capacitor 124.

Also, the control section 540 changes the control signal FFE from logical L to logical H. The control section 540 may preferably change the control signal FFE from logical L to logical H, after the control signal RE has changed to logical H. In this case, the control section 540 may change the control signal FFE from logical L to logical H in synchronism with the timing at which the logical value of the control signal RE is changed.

Also, the control section 540 may preferably change the control signal FFE to logical H, after the power supply voltage to be fed to the flip-flop 110 has risen to VCC. When the control signal FFE has changed to logical H, the first inverter 122 and the second inverter 114 both output logical H, because the potentials on the first terminal 116 and the second terminal 118 before the control signal FEE changes to logical H are both 0V.

It is noted here that, because the capacity C1, which is greater than that appended to the first terminal 116, is appended to the second terminal 118, the potential of an input to the first inverter 112, in other words, on the first terminal 116, rises quicker than the potential of an input to the second inverter 118, in other words, on the second terminal 118. In other words, the potential of the input to the first inverter 112 reaches the threshold voltage Vt earlier than the potential of the input to the second inverter 114 does. Accordingly, when the control signal FFE changes to logical H, the output of the second inverter 114 becomes to be logical H, and the output of the first inverter 112 becomes to be logical L. By this, the flip-flop 110 retains memory data in which the potential on the first terminal 116 is logical H, and the logical value on the second terminal 118 is logical L. By the operations described above, memory data stored in the storage section 120 is read out, and the memory data is retained at the flip-flop 110.

Figure 9:
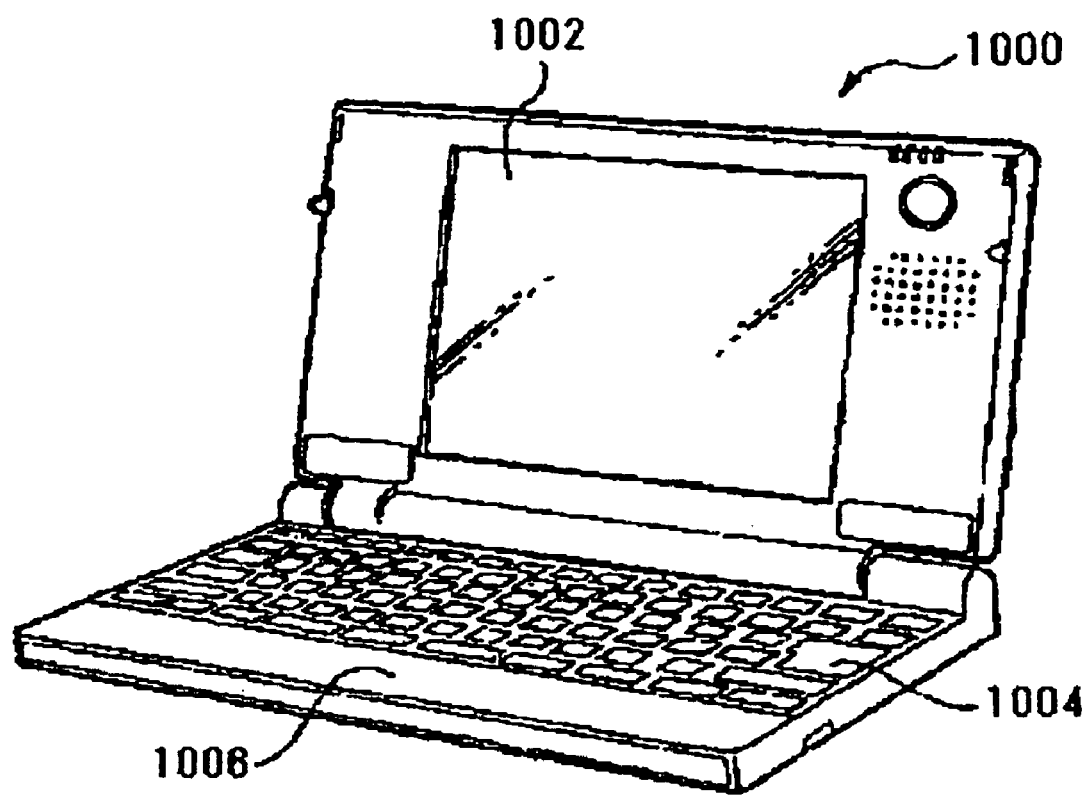
FIG. 9 is a perspective view showing a structure of a personal computer 1000, which is an example of an electronic apparatus in accordance with an embodiment of the present invention.

FIG. 9 is a perspective view showing a structure of a personal computer 1000, which is an example of an electronic apparatus in accordance with an embodiment of the present invention. In FIG. 9, the personal computer 1000 has a structure equipped with a display panel 1002 and a main body 1006 having a keyboard 1004. As storage medium, and in particular, as a nonvolatile memory of the main body 1006 of the personal computer 1000, a semiconductor device equipped with a storage circuit in accordance with the present invention is used.

The embodiment examples and application examples described above with reference to the embodiments of the present invention may be appropriately combined depending on the usages, or may be used with changes and/or improvements added thereto. The present invention is not limited to the descriptions of the embodiments above. It is clear from the description in the scope of patent claims that modes created by such combinations, changes and/or improvements can be included in the technical scope of the present invention.

What is claimed is:

1. A storage circuit characterized in comprising:
a first ferroelectric capacitor and a second ferroelectric capacitor each having one end and another end;
a first connecting section that is electrically connected to the one end of the first ferroelectric capacitor and the other end of the second ferroelectric capacitor;
a second connecting section that is electrically connected to the other end of the first ferroelectric capacitor and the one end of the second ferroelectric capacitor; and
a potential difference supply section that gives a predetermined potential difference between the one end of the first ferroelectric capacitor and the one end of the second ferroelectric capacitor.

2. A storage circuit according to claim 1, characterized in that the potential difference supply section has a flip-flop having a first terminal and a second terminal, wherein the flip-flop provides the predetermined potential difference between the first terminal and the second terminal, thereby giving the predetermined potential difference between the one end of the first ferroelectric capacitor and the one end of the second ferroelectric capacitor.

3. A storage circuit according to claim 1, characterized in that
the first connecting section has a first switch provided between the one end of the first ferroelectric capacitor and the other end of the second ferroelectric capacitor, and
the second connecting section has a second switch provided between the other end of the first ferroelectric capacitor and the one end of the second ferroelectric capacitor.

4. A storage circuit according to claim 3, characterized in that
the potential difference supply section gives a predetermined potential difference between the one end of the first ferroelectric capacitor and the one end of the second ferroelectric capacitor, thereby writing data in the first ferroelectric capacitor and the second ferroelectric capacitor, and
the storage circuit is further equipped with
a reading section that reads, based on capacity of the first ferroelectric capacitor and the second ferroelectric capacitor, data written in the first ferroelectric capacitor and the second ferroelectric capacitor, and
a control section that makes the first switch and the second switch conductive when the potential difference supply section writes the data in the first ferroelectric capacitor and the second ferroelectric capacitor, and makes the first switch and the second switch nonconductive when the reading section reads the data written in the first ferroelectric capacitor and the second ferroelectric capacitor.

5. A storage circuit according to claim 1, characterized in further comprising a discharge section that brings potentials on the other end of the first ferroelectric capacitor and the other end of the second ferroelectric capacitor to generally an identical potential.

6. A semiconductor device characterized in comprising the storage circuit recited in claim 1.

7. An electronic apparatus characterized in comprising the semiconductor device recited in claim 6.

* * * * *